US012542255B2

(12) United States Patent
Koshimizu

(10) Patent No.: US 12,542,255 B2
(45) Date of Patent: Feb. 3, 2026

(54) PLASMA PROCESSING APPARATUS AND PLASMA PROCESSING METHOD

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 297 days.

(21) Appl. No.: 17/844,721

(22) Filed: Jun. 21, 2022

(65) Prior Publication Data

US 2022/0406566 A1 Dec. 22, 2022

(30) Foreign Application Priority Data

Jun. 21, 2021 (JP) ................................ 2021-102226

(51) Int. Cl.
*H01J 37/32* (2006.01)

(52) U.S. Cl.
CPC .. *H01J 37/32091* (2013.01); *H01J 37/32137* (2013.01); *H01J 37/32146* (2013.01); *H01J 37/32532* (2013.01)

(58) Field of Classification Search
CPC ...................... H01J 37/32155; H01J 37/32146
See application file for complete search history.

(56) References Cited

U.S. PATENT DOCUMENTS 6,110,287 A * 8/2000 Arai .................... C23C 16/5096 204/298.07
2008/0237031 A1* 10/2008 Sato .................. H01J 37/32082 118/712
2011/0137446 A1* 6/2011 Valcore, Jr. ......... H01J 37/3299 700/108
2014/0345802 A1* 11/2014 Umehara .......... H01J 37/32568 156/345.28
2017/0103873 A1* 4/2017 Kawasaki .......... H01J 37/32183

FOREIGN PATENT DOCUMENTS

JP 2009-246091 A 10/2009
JP 2020004710 A * 1/2020 ....... H01L 21/67069

OTHER PUBLICATIONS

Wang, Meizhong (Understandable Electric Circuits, 2nd edition. 2019 pp. 258-266). (Year: 2019).*
Chang, Kai (Encyclopedia of RF and Microwave Engineering, vols. 1-6—Attenuators. pp. 452-480). (Year: 2005).*
English machine translation of Koshimizu (JP2020004710A) retrieved from ESPACENET May 30, 2025 (Year: 2025).*

* cited by examiner

*Primary Examiner* — Ram N Kackar
*Assistant Examiner* — Laureen Chan
(74) *Attorney, Agent, or Firm* — XSENSUS LLP

(57) ABSTRACT

A plasma processing apparatus disclosed herein includes a substrate support provided in a chamber; a radio-frequency power supply configured to supply radio-frequency power to generate plasma in the chamber; and a bias power supply configured to supply electric bias energy to an electrode to draw ions into a substrate on the substrate support. The electric bias energy has a cycle having a time length reciprocal to a bias frequency. The radio-frequency power supply is further configured to adjust an output power level of the radio-frequency power in a plurality of phase periods in the cycle such that an evaluation value is less than or equal to a first value, the evaluation value being a power level of reflected waves of the radio-frequency power or a value of a ratio of the power level to the output power level.

10 Claims, 10 Drawing Sheets

PLASMA PROCESSING APPARATUS AND PLASMA PROCESSING METHOD

CROSS-REFERENCE TO RELATED APPLICATION

This application claims priority to Japanese Patent Application No. 2021-102226, filed on Jun. 21, 2021, the entire contents of which are incorporated herein by reference.

TECHNICAL FIELD

Exemplary embodiments of the present disclosure relate to a plasma processing apparatus and a plasma processing method.

BACKGROUND

A plasma processing apparatus is used in plasma processing with respect to a substrate. In the plasma processing apparatus, radio-frequency bias power is used to draw ions from plasma generated in a chamber into a substrate. Patent Document 1 discloses a plasma processing apparatus that modulates the power level and frequency of a radio-frequency bias power.

PRIOR ART DOCUMENTS

Patent Documents

[Patent Document 1]

Japanese Patent Application Publication No. 2009-246091

SUMMARY

Technical Problem

The present disclosure provides a technique for suppressing reflection of radio-frequency power used for plasma generation.

Solution to Problem

In an exemplary embodiment, a plasma processing apparatus, comprises a chamber, a substrate support, a radio-frequency power supply and a bias power supply. The substrate support is provided in the chamber, the substrate support including an electrode. The radio-frequency power supply is configured to supply radio-frequency power to generate plasma in the chamber. The bias power supply is configured to supply electric bias energy to the electrode to draw ions into a substrate placed on the substrate support. The electric bias energy has a cycle having a time length which is a reciprocal of a bias frequency. The radio-frequency power supply is further configured to adjust an output power level of the radio-frequency power in a plurality of phase periods in the cycle such that an evaluation value is less than or equal to a first value, the evaluation value being a power level of reflected waves of the radio-frequency power or a value of a ratio of the power level of the reflected waves to the output power level of the radio-frequency power in the plurality of phase periods in the cycle.

Advantageous Effects

According to an exemplary embodiment, it is possible to suppress the reflection of the radio-frequency power used for the generation of plasma.

DETAILED DESCRIPTION OF THE DRAWINGS

Figure 1:
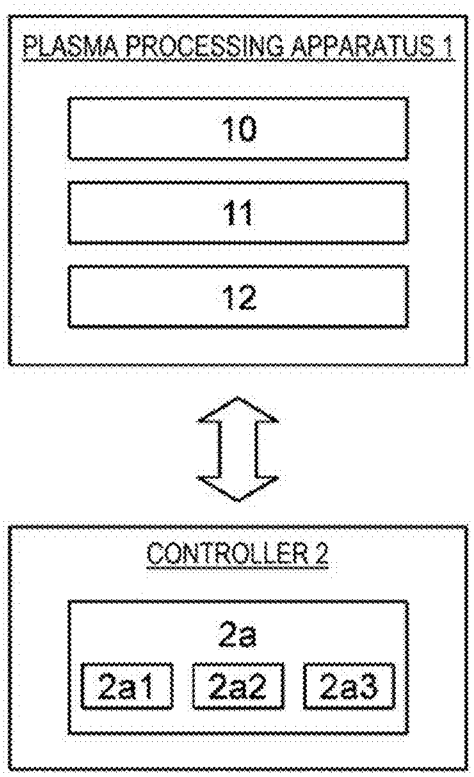
FIG. 1 is a diagram schematically showing a plasma processing apparatus according to an exemplary embodiment.

Hereinafter, various exemplary embodiments will be described.

In an exemplary embodiment, a plasma processing apparatus is provided. The plasma processing apparatus includes a chamber, a substrate support, a radio-frequency power supply, and a bias power supply. The substrate support includes an electrode and is provided in the chamber. The radio-frequency power supply is configured to supply radio-frequency power to generate plasma in the chamber. A bias power supply is electrically coupled to the electrode, and configured to supply electric bias energy to the electrode of the substrate support to draw ions into the substrate placed on the substrate support. The electric bias energy has a cycle having a time length that is the reciprocal of a bias frequency. The radio-frequency power supply is configured to adjust the output power level of the radio-frequency power in a plurality of phase periods in the cycle such that an evaluation value in the plurality of phase periods in the cycle is equal to or less than an allowable value. The evaluation value is a value of the power level of the reflected waves of the radio-frequency power or the ratio of the power level of the reflected waves to the output power level of the radio-frequency power.

The power level of the reflected waves of the radio-frequency power fluctuates in the cycle of the electric bias energy. In the embodiment described above, the output power level of the radio-frequency power in the plurality of phase periods in the cycle is adjusted such that the evaluation value regarding the power level of the reflected waves in the plurality of phase periods in the cycle is equal to or less than an allowable value. Therefore, reflection of the radio-frequency power used for plasma generation is suppressed.

In one exemplary embodiment, one or more phase periods in which the evaluation value is larger than the allowable value may be specified among the plurality of phase periods in a preceding cycle of the electric bias energy. The radio-frequency power supply may be configured to reduce the output power level of the radio-frequency power in each of the one or more phase periods in the subsequent cycle of the electric bias energy such that the evaluation value is equal to or less than the allowable value.

In one exemplary embodiment, the radio-frequency power supply may be configured to adjust the output power level of the radio-frequency power such that a decrement in the output power level of the radio-frequency power in each of the one or more phase periods is compensated in the phase periods other than the one or more phase periods in the cycle.

In one exemplary embodiment, the radio-frequency power supply may be configured to adjust the output power level of the radio-frequency power in the phase periods other than the one or more phase periods in the cycle such that the average value of the output power level of the radio-frequency power in the cycle becomes a predetermined value.

In one exemplary embodiment, the radio-frequency power supply may be configured to adjust the output power level of the radio-frequency power in the phase periods other than the one or more phase periods in the cycle such that the peak value of the voltage of the electric bias energy in the substrate in the cycle becomes a predetermined value.

In one exemplary embodiment, the radio-frequency power supply may include a signal generator and an amplifier. The signal generator is configured to generate a radio-frequency signal. The amplifier is configured to amplify the radio-frequency signal to generate radio-frequency power.

In one exemplary embodiment, the radio-frequency power supply may be configured to adjust the output power level of the radio-frequency power by adjusting the amplitude of the radio-frequency signal.

In one exemplary embodiment, the radio-frequency power supply may be configured to adjust the output power level of the radio-frequency power by adjusting the amplification factor of the radio-frequency signal in the amplifier.

In one exemplary embodiment, the radio-frequency power supply may include a signal generator, an attenuator, and an amplifier. The signal generator is configured to generate a radio-frequency signal. The attenuator is configured to attenuate the radio-frequency signal to generate an attenuated signal. The amplifier may be configured to amplify the attenuated signal to generate radio-frequency power. The radio-frequency power supply may be configured to adjust the output power level of the radio-frequency power by adjusting the attenuation factor of the radio-frequency signal in the attenuator.

In one exemplary embodiment, the radio-frequency power supply may be configured to set the frequency of the radio-frequency power in each of the plurality of phase periods in the cycle to a frequency determined in advance so as to suppress the power level of the reflected waves of the radio-frequency power.

In another exemplary embodiment, a plasma processing method is provided. The plasma processing method includes (a) placing a substrate on a substrate support provided in a chamber of a plasma processing apparatus. The plasma processing method further includes (b) supplying radio-frequency power from a radio-frequency power supply to generate plasma in the chamber. The plasma processing method further includes (c) supplying electric bias energy from a bias power supply to the electrode in the substrate support to draw ions from the plasma into the substrate. The plasma processing method further includes (d) adjusting an output power level of the radio-frequency power. The electric bias energy has a cycle having a time length that is the reciprocal of a bias frequency. In step (d), the output power level of the radio-frequency power in a plurality of phase periods in a cycle is adjusted such that an evaluation value in the plurality of phase periods is equal to or less than an allowable value. The evaluation value is a value of the power level of the reflected waves of the radio-frequency power or the ratio of the power level of the reflected waves to the output power level of the radio-frequency power.

In one exemplary embodiment, one or more phase periods in which the evaluation value is larger than the allowable value may be specified among the plurality of phase periods in a preceding cycle of the electric bias energy. In step (d), the output power level of the radio-frequency power in one or more phase periods in the subsequent cycle of the electric bias energy may be reduced such that the evaluation value is equal to or less than the allowable value.

In one exemplary embodiment, in step (d), the output power level of the radio-frequency power may be adjusted such that a decrement in the output power level of the radio-frequency power in each of the one or more phase periods in the cycle is compensated in the phase periods other than the one or more phase periods in the cycle.

In one exemplary embodiment, in step (d), the output power level of the radio-frequency power in the phase periods other than the one or more phase periods in the cycle may be adjusted such that the average value of the output power level of the radio-frequency power in the cycle becomes a predetermined value.

In one exemplary embodiment, in step (d), the output power level of the radio-frequency power in the phase periods other than the one or more phase periods in the cycle may be adjusted such that the peak value of the voltage of the electric bias energy in the substrate in the cycle becomes a predetermined value.

In one exemplary embodiment, the frequency of the radio-frequency power in each of the plurality of phase periods of the cycle may be set to a frequency determined in advance so as to suppress the power level of the reflected waves of the radio-frequency power.

Hereinafter, various exemplary embodiments will be described in detail with reference to the drawings. Further, like reference numerals will be given to like or corresponding parts throughout the drawings.

Figure 2:
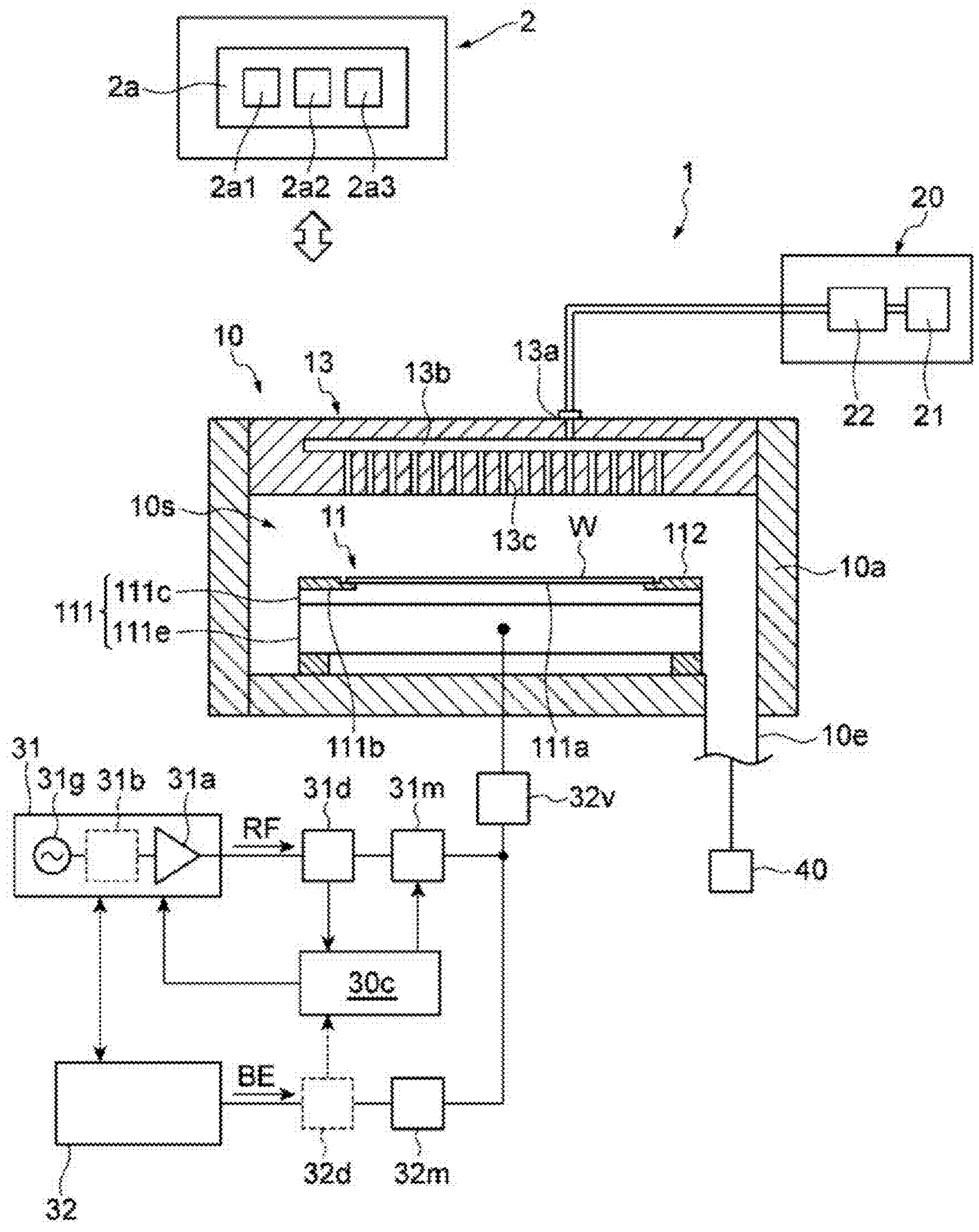
FIG. 2 is a diagram schematically illustrating a plasma processing apparatus according to an exemplary embodiment.

FIGS. 1 and 2 are diagrams schematically illustrating a plasma processing apparatus according to one exemplary embodiment.

In an embodiment, a plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. For example, the computer 2*a* may include a processor (central processing unit (CPU)) 2*a*1, a storage 2*a*2, and a communication interface 2*a*3. The processor 2*a*1 may be configured to perform various control operations based on a program stored in the storage 2*a*2. The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Hereinafter, a configuration example of a capacitively coupled plasma processing apparatus as an example of the plasma processing apparatus 1 will be described. A capacitively coupled plasma processing apparatus 1 includes a plasma processing chamber 10, a gas supply 20, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The sidewall 10*a* is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111*a* for supporting the substrate (wafer) W, and an annular region (ring support surface) 111*b* for supporting the ring assembly 112. The annular region 111*b* of the main body 111 surrounds the central region 111*a* of the main body 111 in a plan view. The substrate W is disposed on the central region 111*a* of the main body, 111 and the ring assembly 112 is disposed on the annular region 111*b* of the main body 111 to surround the substrate W on the central region 111*a* of the main body 111. In one embodiment, the main body 111 includes a base 111*e* and an electrostatic chuck 111*c*. The base 111*e* includes a conductive member. The conductive member of the base 111*e* functions as a lower electrode. The electrostatic chuck 111*c* is disposed on the base 111*e*. The upper surface of the electrostatic chuck 111*c* has the substrate support surface 111*a*. The ring assembly 112 includes one or more annular members. At least one of the one or more annular members is an edge ring. Further, although not illustrated, the substrate support 11 may include the temperature control module configured to adjust at least one of an electrostatic chuck 111*c*, the ring assembly 112 and the substrate W to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10*a*.

The gas supply 20 may include one or more gas sources 21 and at least one or more flow rate controllers 22. In one embodiment, the gas supply 20 is configured to supply one or more processing gases from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse the flow rates of the one or more processing gases.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The plasma processing apparatus 1 includes a radio-frequency power supply 31 and a bias power supply 32. The plasma processing apparatus 1 may further include a controller 30*c*.

The radio-frequency power supply 31 is configured to generate a radio-frequency power RF to generate plasma in the chamber (the plasma processing chamber 10). For example, the radio-frequency power RF has a frequency of 13 MHz or more and 150 MHz or less. In one embodiment, the radio-frequency power supply 31 may include a radio-frequency signal generator 31*g* and an amplifier 31*a*. The radio-frequency signal generator 31*g* generates a radio-frequency signal. The amplifier 31*a* generates the radio-frequency power RF by amplifying the radio-frequency signal input from radio-frequency signal generator 31*g*, and outputs the radio-frequency power RF. The radio-frequency power supply 31 may further include an attenuator 31*b*. The attenuator 31*b* is coupled between the radio-frequency signal generator 31*g* and the amplifier 31*a*. The attenuator 31*b* attenuates the radio-frequency signal input from the radio-frequency signal generator 31*g* to generate an attenuated signal, and the amplifier 31*a* generates the radio-frequency power RF by amplifying the attenuated signal.

In one embodiment, the radio-frequency power supply 31 is coupled to a bias electrode via a matcher 31*m*. The base 111*e* serves as a bias electrode in one embodiment. In another embodiment, the bias electrode may be an electrode provided in the electrostatic chuck 111*c*. The matcher 31*m* includes a matching circuit. The matching circuit of the matcher 31*m* has a variable impedance. The matching circuit of the matcher 31*m* is controlled by a controller 30*c*. The impedance of the matching circuit of the matcher 31*m* is adjusted to match the impedance on the load side of the radio-frequency power supply 31 with the output impedance of the radio-frequency power supply 31. The radio-frequency power supply 31 may be coupled to the upper electrode via the matcher 31*m*.

The bias power supply 32 is configured to supply an electric bias energy BE to the bias electrode to draw ions into the substrate W placed on the substrate support 11. The bias power supply 32 may continuously apply the electric bias energy BE to the bias electrode. Further, the radio-frequency power supply 31 may also continuously supply the radio-frequency power RF. That is, the radio-frequency power RF and the electric bias energy BE are supplied at the same time in a single overlapping period OP.

Alternatively, the bias power supply 32 is configured to apply a pulse BEP of the electric bias energy BE to the bias electrode in each of a plurality of pulse periods PP. The bias power supply 32 may specify the timing of each of the plurality of pulse periods PP by a signal supplied from a pulse controller. The controller 2 may function as a pulse controller.

Here, reference will be made to FIGS. 3A, 3B, 4A, and 4B. FIGS. 3A, 3B, 4A, and 4B are timing charts illustrating an example of the radio-frequency power RF and the electric bias energy BE. In these drawings, "ON" of the radio-frequency power RF indicates that the radio-frequency power RF is being supplied, and "OFF" of the radio-frequency power RF indicates that the supply of the radio-frequency power RF is stopped. Further, "ON" of the electric bias energy BE indicates that the electric bias energy BE is being applied to the bias electrode, and "OFF" of the electric bias energy BE indicates that the electric bias energy BE is not being applied to the bias electrode. Further, "HIGH" of the electric bias energy BE indicates that the electric bias energy BE having a level higher than the level of the electric bias energy BE indicated by "LOW" is being applied to the bias electrode.

The plurality of pulse periods PP appear temporally sequentially. The plurality of pulse periods PP may sequentially appear at time intervals (cycles) defined by a pulse frequency. In the following description, a pulse period PP(k) represents a k-th pulse period among the plurality of pulse periods PP. That is, the pulse period PP(k) represents any pulse period among the plurality of pulse periods PP. The pulse frequency is lower than a bias frequency to be described later, and is, for example, a frequency of 1 kHz or more and 100 kHz or less. As described above, the pulse BEP of the electric bias energy BE is applied to the bias electrode in each of the plurality of pulse periods PP. In the periods other than the plurality of pulse periods PP, the electric bias energy BE may not be applied to the bias electrode. Alternatively, the electric bias energy BE having a level lower than the level of the electric bias energy BE in the plurality of pulse periods PP may be applied to the bias electrode in the periods other than the plurality of pulse periods PP.

Figure 3A:
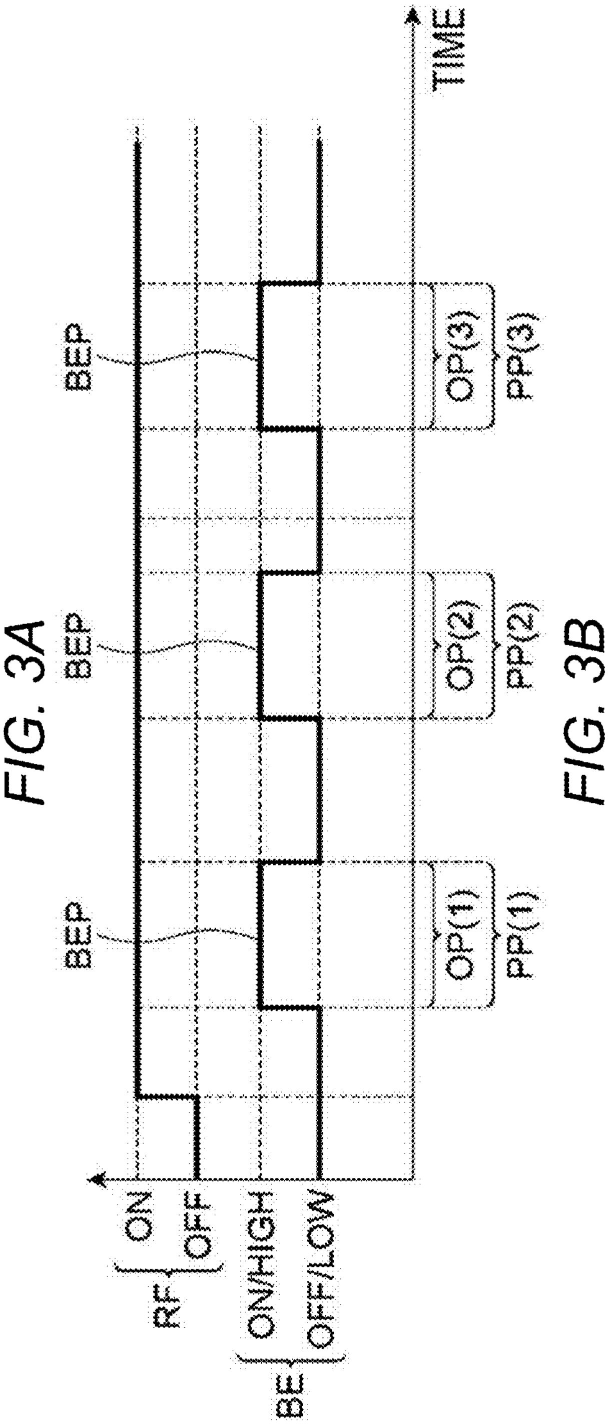
FIGS. 3A and 3B are timing charts illustrating an example of radio-frequency power and electric bias energy, respectively.

As illustrated in FIG. 3A, the radio-frequency power RF may be supplied as a continuous wave. In the example illustrated in FIG. 3A, a plurality of overlapping periods OP in which the radio-frequency power RF and the electric bias energy BE in an ON or HIGH state are supplied at the same time respectively coincides with the plurality of pulse periods PP.

Figure 3B:
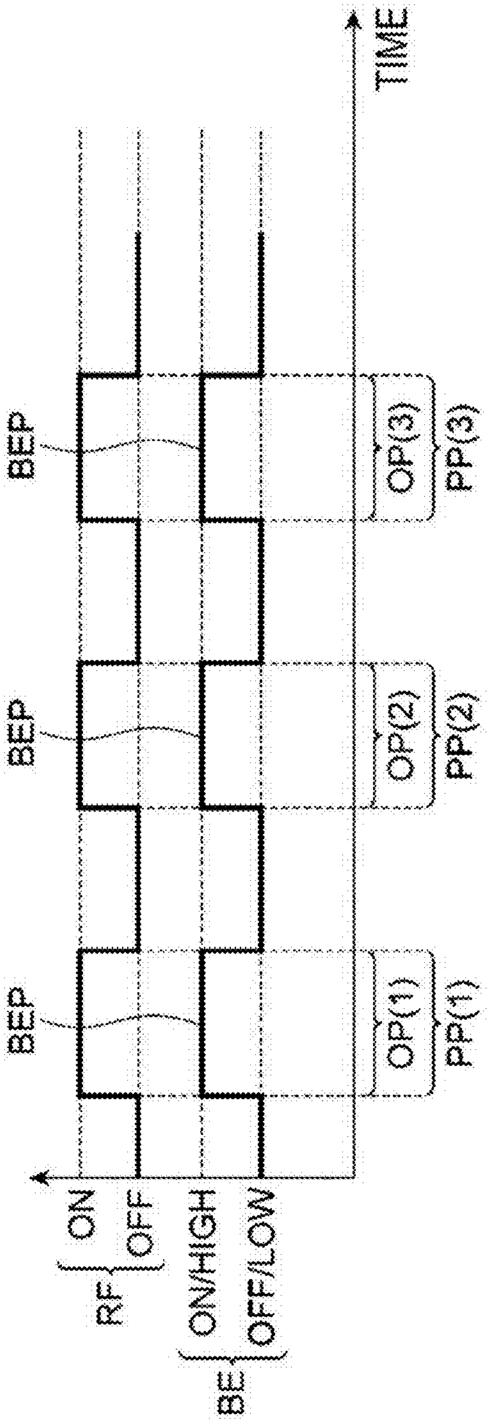
Figure 4A:
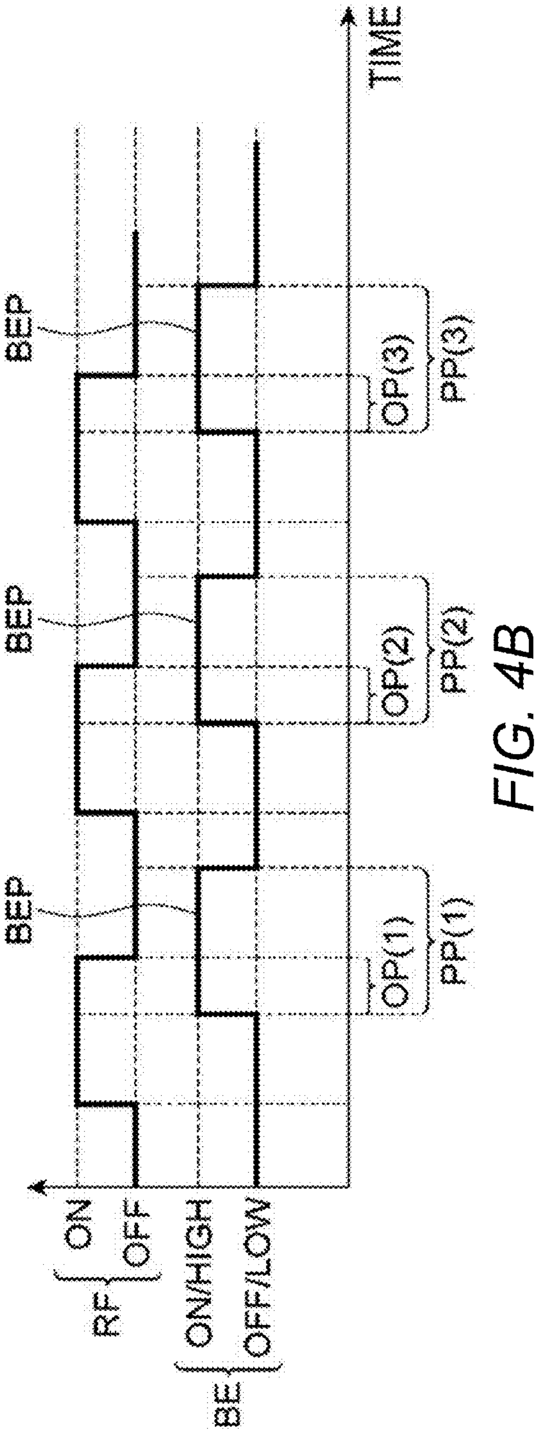
FIGS. 4A and 4B are timing charts illustrating an example of radio-frequency power and electric bias energy, respectively.
Figure 4B:
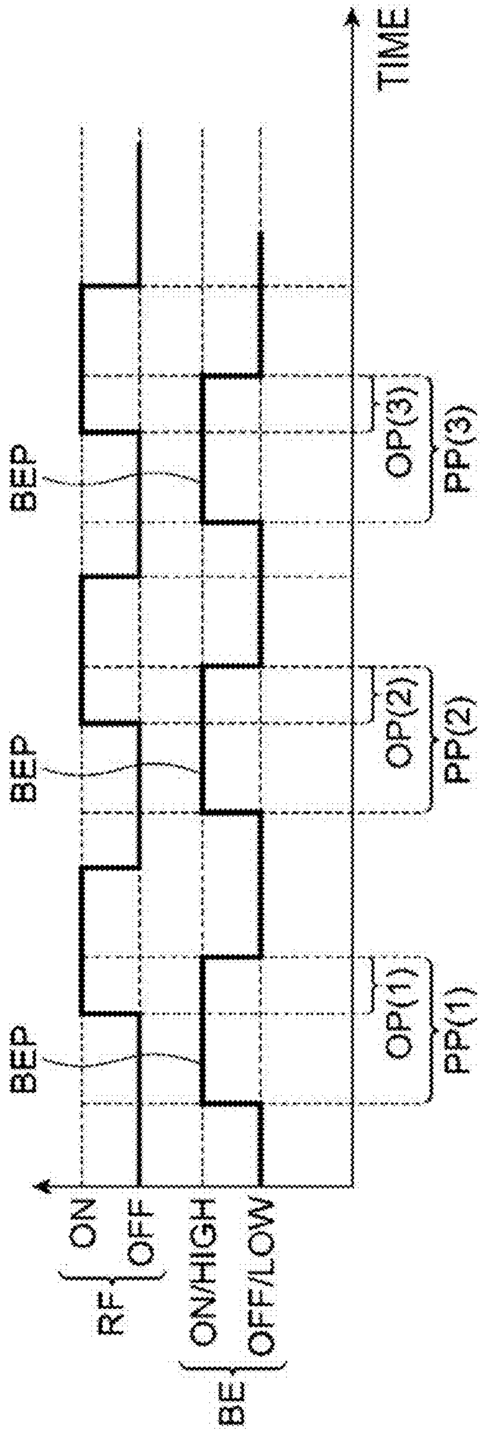

Alternatively, as illustrated in FIGS. 3B, 4A, and 4B, the pulse of the radio-frequency power RF may be supplied. The radio-frequency power supply 31 may specify the timing of the period in which the pulse of the radio-frequency power RF is supplied, based on the signal supplied from the pulse controller described above.

As illustrated in FIG. 3B, the pulse of the radio-frequency power RF may be supplied in each of a plurality of periods that respectively coincide with the plurality of pulse periods PP. In the example illustrated in FIG. 3B, a plurality of overlapping periods OP in which the radio-frequency power RF and the electric bias energy BE in an ON or HIGH state are supplied at the same time respectively coincides with the plurality of pulse periods PP.

As illustrated in FIGS. 4A and 4B, the pulse of the radio-frequency power RF may be supplied in each of a plurality of periods that partially overlap with the plurality of pulse periods PP respectively. In the example illustrated in each of FIGS. 4A and 4B, each of the plurality of overlapping periods OP in which the radio-frequency power RF and the electric bias energy BE in an ON or HIGH state are supplied at the same time is a part of the corresponding pulse period PP among the plurality of pulse periods PP.

In the following description, an overlapping period OP(k) represents a k-th overlapping period among the plurality of overlapping periods OP. That is, the overlapping period OP(k) represents any overlapping period among the plurality of overlapping periods OP.

The electric bias energy BE is applied to the bias electrode in each of a plurality of cycles CY included in each of the single overlapping period OP or the plurality of pulse periods PP described above. The plurality of cycles CY are defined by a bias frequency. The bias frequency is, for example, a frequency of 50 kHz or more and 27 MHz or less. The time length of each of the plurality of cycles CY is the reciprocal of the bias frequency. The plurality of cycles CY appear temporally sequentially. In the following description, a cycle CY(m) represents an m-th cycle among the plurality of cycles CY in each of the single overlapping period OP or the plurality of overlapping periods OP. Further, a cycle CY(k, m) represents the m-th cycle in the k-th overlapping period.

Figure 5:
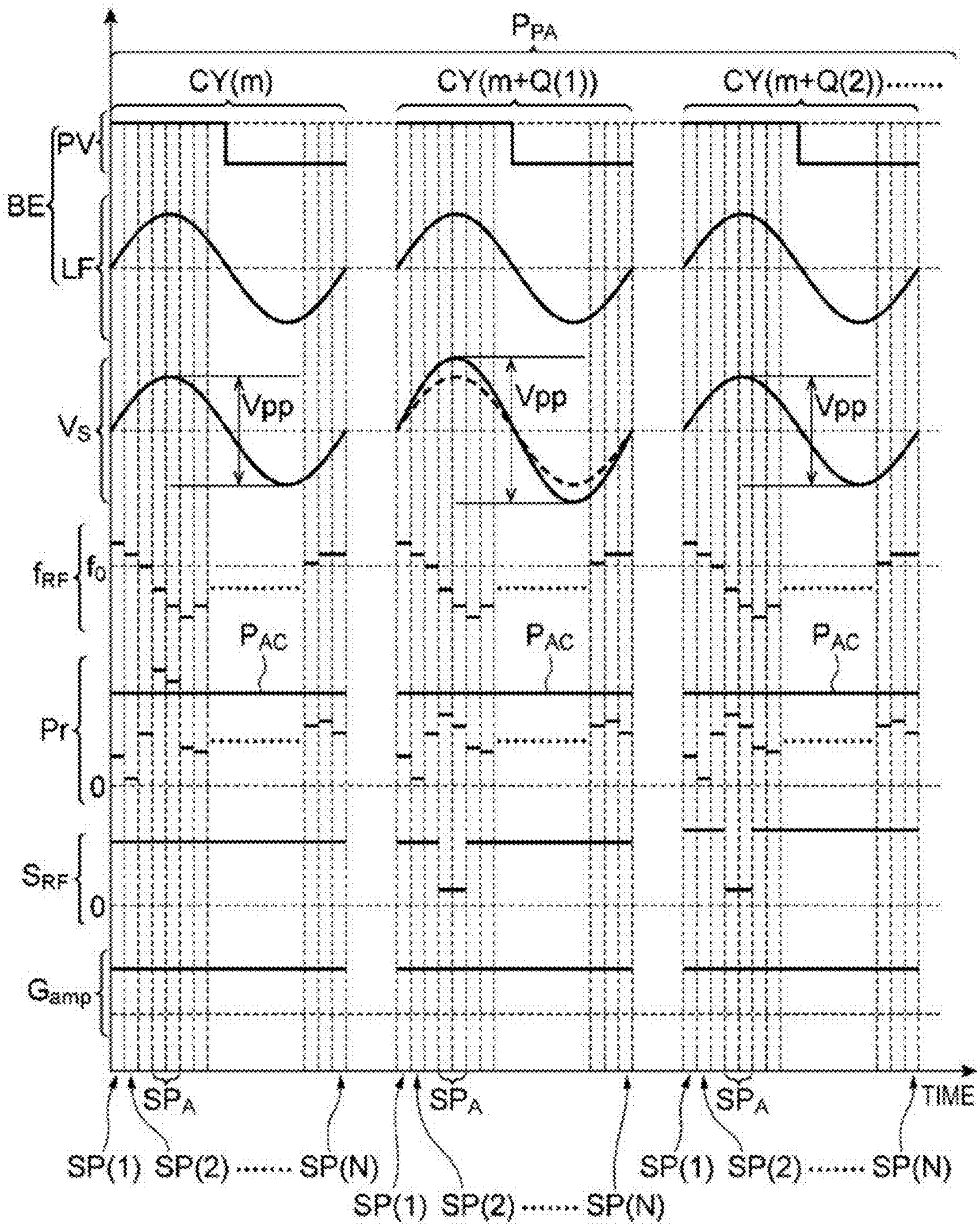
FIG. 5 is a timing chart of an example related to a power adjustment period in the plasma processing apparatus according to the exemplary embodiment.
Figure 6:
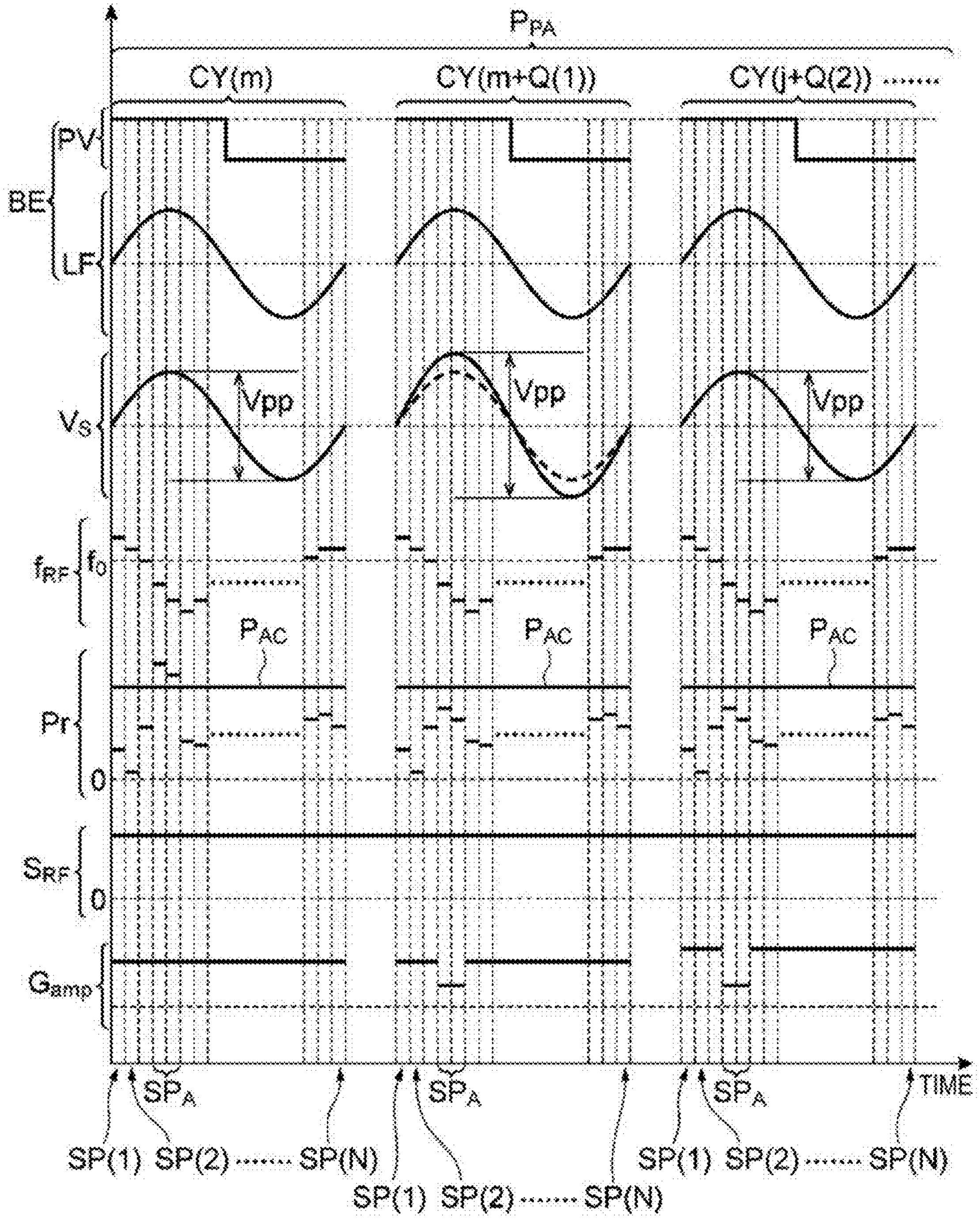
FIG. 6 is a timing chart of an example related to the power adjustment period in the plasma processing apparatus according to the exemplary embodiment.

Here, reference will be made to FIGS. 5 and 6. Each of FIGS. 5 and 6 is an example timing chart related to a power adjustment period in the plasma processing apparatus according to one exemplary embodiment. In each of FIGS. 5 and 6, the electric bias energy BE, a voltage VS of the electric bias energy BE in the substrate W, a frequency $f_{RF}$ of the radio-frequency power RF, a power level Pr of the reflected waves from the load of the radio-frequency power RF, an amplitude SRF of the radio-frequency signal generated by the radio-frequency signal generator 31*g*, and an amplification factor Gamp of the amplifier 31*a* are illustrated.

As illustrated in FIGS. 5 and 6, in one embodiment, the electric bias energy BE may be a radio-frequency power having a bias frequency, that is, a radio-frequency bias power LF. In this case, as illustrated in FIG. 2, the bias power supply 32 is coupled to the bias electrode via a matcher 32*m*. The matcher 32*m* includes a matching circuit. The matching circuit of the matcher 32*m* has a variable impedance. The matching circuit of the matcher 32*m* is controlled by the controller 30*c*. The impedance of the matching circuit of the matcher 32*m* is adjusted to match the impedance on the load side of the bias power supply 32 with the output impedance of the bias power supply 32.

In another embodiment, the electric bias energy BE may include the pulse PV of the voltage that is applied to the bias electrode in each of the plurality of cycles CY. The pulse of the voltage used as the electric bias energy BE may be a pulse of a negative voltage or a pulse of a negative direct-current voltage. The pulse PV of the voltage may have any waveform such as a triangular wave or a rectangular wave. In a case where the pulse PV of the voltage is used as the electric bias energy BE, a filter that blocks the radio-frequency power RF may be coupled between the bias power supply 32 and the bias electrode, instead of the matcher 32*m* illustrated in FIG. 2.

In the plasma processing apparatus 1, the radio-frequency power supply 31 and the bias power supply 32 are synchronized with each other to adjust the frequency and the power level of the radio-frequency power RF in each of the plurality of cycles CY. The synchronization signal used for this purpose may be supplied from the bias power supply 32 to the radio-frequency power supply 31. Alternatively, the synchronization signal may be supplied from the radio-frequency power supply 31 to the bias power supply 32. Alternatively, the synchronization signal may be supplied from another device such as the controller 30*c* to the radio-frequency power supply 31 and the bias power supply 32. For example, the synchronization signal may be generated by the controller 30*c* by using the traveling wave of the electric bias energy BE output from the directional coupler 32*d*.

The controller 30*c* is configured to control the radio-frequency power supply 31. The controller 30*c* may be configured by a processor such as a CPU. The controller 30*c* may be a part of the matcher 31*m* or a part of the radio-frequency power supply 31. The controller 30*c* may be separate from the matcher 31*m* and the radio-frequency power supply 31. Alternatively, the controller 2 may also function as the controller 30*c*.

The radio-frequency power supply 31 is configured to adjust the output power level of the radio-frequency power RF in a power adjustment period PPA. The power adjustment period PPA is a period after a frequency setting period $P_{fset}$ described later. The power adjustment period PPA includes the single overlapping period OP or a plurality of overlapping periods OP. The radio-frequency power supply 31 adjusts the output power level of the radio-frequency power RF in the plurality of cycles CY included in each of the single overlapping period OP or the plurality of overlapping periods OP in the power adjustment period PPA.

Each of the plurality of cycles CY includes N phase periods SP(1) to SP(N). That is, each of the plurality of cycles CY is divided into N phase periods SP(1) to SP(N). N is an integer of 2 or more. In each of the plurality of cycles CY, a plurality of phase periods SP may have the same time length or different time lengths. In the following description, the phase period SP(n) represents an n-th phase period among the phase periods SP(1) to SP(N). Further, a phase period SP(m, n) represents the n-th phase period in the cycle CY(m).

The radio-frequency power supply 31 is configured to adjust the output power level of the radio-frequency power RF in the plurality of phase periods SP in a cycle CY such that an evaluation value in the plurality of phase periods SP in the cycle CY becomes an allowable value PAC or less. As illustrated in FIG. 5, the evaluation value may be a power level Pr of the reflected waves of the radio-frequency power RF. Alternatively, the evaluation value may be the value of the ratio of the power level Pr of the reflected waves of the radio-frequency power RF to the output power level of the radio-frequency power RF. The allowable value PAC can be determined according to the characteristics of the radio-frequency power supply 31 or the amplifier 31*a*.

In one embodiment, the plasma processing apparatus 1 may further include a directional coupler 31*d*. The directional coupler 31*d* may be coupled between the radio-frequency power supply 31 and the matcher 31*m*. The directional coupler 31*d* may be coupled between the matcher 31*m* and the bias electrode or the upper electrode. The directional coupler 31*d* may be a part of the matcher 31*m*.

The directional coupler 31*d* is configured to separate the reflected waves of the radio-frequency power RF from the other radio frequencies. The directional coupler 31*d* may include a detector that detects the power level Pr of the reflected waves of the radio-frequency power RF. The power level Pr in each of phase periods SP(1) to SP(N) in each of the plurality of cycles CY is notified to the controller 30*c*. The controller 30*c* determines an evaluation value from the power level Pr in each phase period SP in each cycle CY, and controls the radio-frequency power supply 31 to adjust the output power level of the radio-frequency power RF in each phase period SP in each cycle CY such that the evaluation value is equal to or less than the allowable value PAC.

In one embodiment, one or more phase periods SPA in which the evaluation value is larger than the allowable value PAC may be specified among the plurality of phase periods SP in a preceding cycle CY. The controller 30*c* may specify the one or more phase periods SPA from the evaluation value. The radio-frequency power supply 31 may reduce the output power level of the radio-frequency power RF such that the evaluation value is equal to or less than the allowable value PAC in the one or more phase periods SPA in a subsequent cycle CY. The radio-frequency power supply 31 may be controlled by the controller 30*c* to reduce the output power level of the radio-frequency power RF in the one or more phase periods SPA in the subsequent cycle CY. In FIGS. 5 and 6, the preceding cycle CY is represented by a cycle CY(m). The subsequent cycle CY is represented by a cycle CY(m+Q(1)) and a cycle CY(m+Q(2)). Q(1) is an integer of 1 or more, Q(2) is an integer of 2 or more, and Q(1)<Q(2) is satisfied.

In one embodiment, the radio-frequency power supply 31 adjusts the output power level of the radio-frequency power RF such that a decrement in the output power level of the radio-frequency power RF in each of the one or more phase periods SPA in the cycle CY is compensated in the phase periods SP other than the one or more phase periods SPA. For example, the radio-frequency power supply 31 may adjust the output power level of the radio-frequency power RF such that the decrement is compensated equally in all phase periods SP other than the one or more phase periods SPA in the cycle CY(m+Q(1)) after the cycle CY(m+Q(2)). The radio-frequency power supply 31 may be controlled by the controller 30*c* to adjust the output power level of the radio-frequency power RF.

In another embodiment, the radio-frequency power supply 31 may adjust the output power level of the radio-frequency power in the phase periods SP other than one or more phase periods SPA such that the average value of the output power level of the radio-frequency power RF in the cycle CY becomes a predetermined value. For example, the radio-frequency power supply 31 may adjust the output power levels in all phase periods SP other than the one or more phase periods SPA such that the average value of the output power level of the radio-frequency power becomes a predetermined value in the cycle CY (m+Q(2)) after the cycle CY(m+Q(1)). The output power level of the radio-frequency power RF in the phase periods SP other than the one or more phase periods SPA may be increased equally. In this embodiment as well, the radio-frequency power supply 31 may be controlled by the controller 30*c* to adjust the output power level of the radio-frequency power RF.

In still another embodiment, the radio-frequency power supply 31 may adjust the output power level of the radio-frequency power RF in the phase periods SP other than the one or more phase periods SPA in the cycle CY such that a peak value Vpp of the voltage of the electric bias energy BE in the substrate W in the cycle CY becomes a predetermined value. For example, the radio-frequency power supply 31 may adjust the output power level of the radio-frequency power RF in the phase periods SP other than the one or more phase periods SPA such that the peak value Vpp becomes the predetermined value in the cycle CY(m+Q(2)) after the cycle CY(m+Q(1)). The output power level of the radio-frequency power RF in the phase periods SP other than the one or more phase periods SPA may be increased equally. In this embodiment as well, the radio-frequency power supply 31 may be controlled by the controller 30*c* to adjust the output power level of the radio-frequency power RF. The peak value Vpp may be specified by measuring the voltage on the electric path coupling the matcher 32*m* with the bias electrode by a sensor 32*v*. The sensor 32*v* may be a part of the matcher 32*m*.

In one embodiment, the radio-frequency power supply 31 may be configured to adjust the output power level of the radio-frequency power RF by adjusting an amplitude SRF of the radio-frequency signal generated by the radio-frequency signal generator 31*g*, as illustrated in FIG. 5. In another embodiment, the radio-frequency power supply 31 may be configured to adjust the output power level of the radio-frequency power RF by adjusting the amplification factor Gamp of the radio-frequency signal in the amplifier 31*a*, as illustrated in FIG. 6. In still another embodiment, the radio-frequency power supply 31 may be configured to adjust the output power level of the radio-frequency power RF by adjusting the attenuation factor of the radio-frequency signal in the attenuator 31*b*.

The power level Pr of the reflected waves of the radio-frequency power RF fluctuates within the cycle CY of the electric bias energy BE. In the plasma processing apparatus 1, the output power level of the radio-frequency power RF in the plurality of phase periods SP in the cycle CY is adjusted such that the evaluation value of the power level of the reflected waves in the plurality of phase periods SP in the cycle CY is equal to or less than the allowable value PAC. Therefore, the reflection of the radio-frequency power RF used for plasma generation is suppressed. Therefore, the radio-frequency power supply 31 is protected from the reflected waves.

In one embodiment, as illustrated in FIGS. 5 and 6, the radio-frequency power supply 31 may set a frequency $f_{RF}$ of the radio-frequency power RF so as to suppress the power level of the reflected waves of the radio-frequency power RF in the plurality of phase periods SP in each cycle CY in the power adjustment period PPA. The frequency of the frequency $f_{RF}$ of the radio-frequency power RF in each of the plurality of phase periods SP is determined in advance in the frequency setting period $P_{fset}$ before the power adjustment period PPA. The frequency $f_{RF}$ of the radio-frequency power RF in each of the plurality of determined phase periods SP may be stored in a storage device of the controller 2 or the controller 30*c*, or designated as the radio-frequency power supply 31 from the controller 30*c*.

Hereafter, several embodiments related to the determination of the frequency $f_{RF}$ of the radio-frequency power RF performed in advance in the frequency setting period $P_{fset}$ will be described.

[First Embodiment of Frequency $f_{RF}$ Determination]

Figure 7:
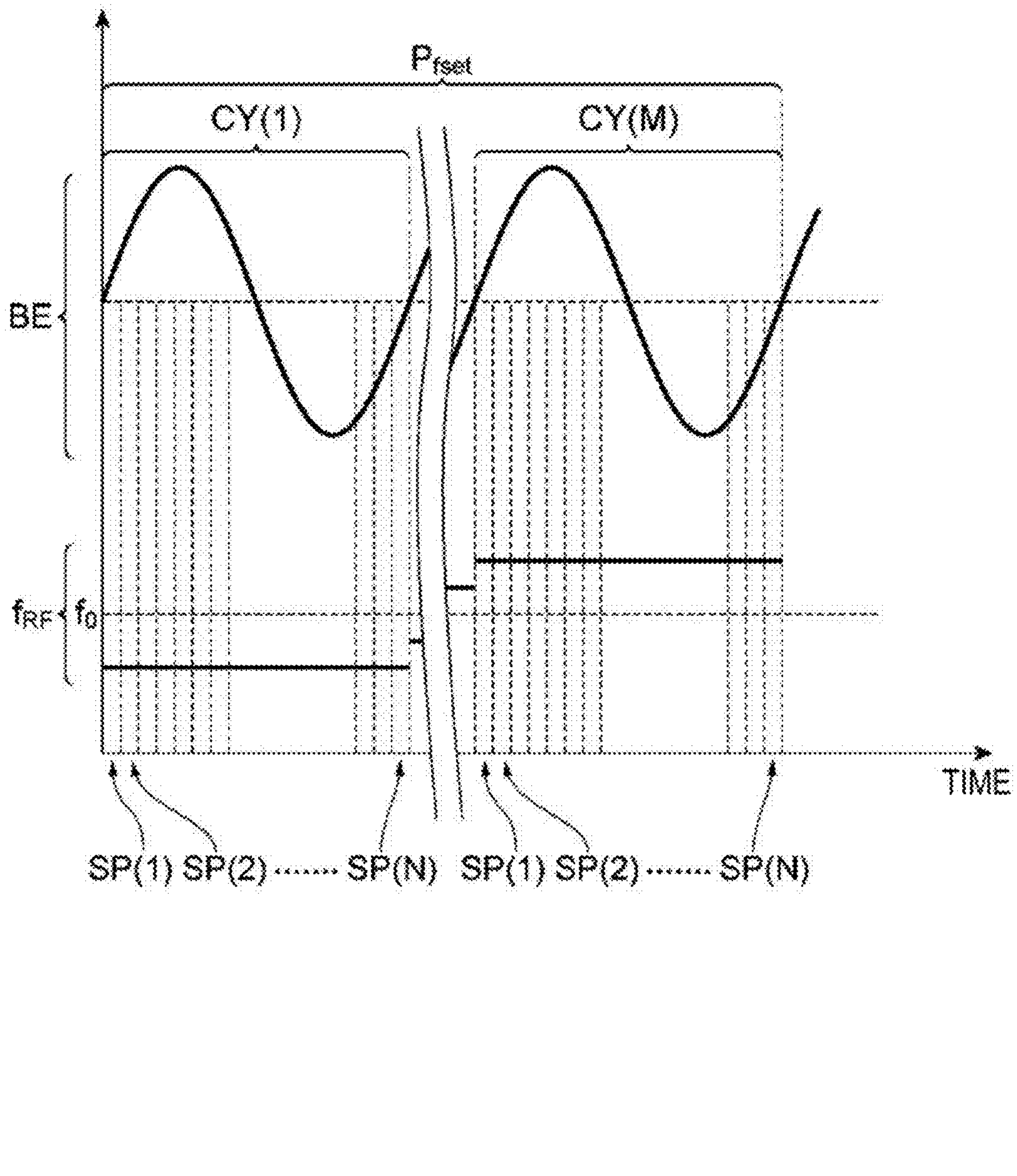
FIG. 7 is a timing chart of an example related to a frequency setting period in the plasma processing apparatus according to the exemplary embodiment.

FIG. 7 is a timing chart of an example related to a frequency setting period in the plasma processing apparatus according to the exemplary embodiment. As illustrated in FIG. 7, in a first embodiment, a frequency setting period $P_{fset}$ includes a plurality of cycles CY (M cycles CY(1) to CY(M))).

The controller 30*c* controls the radio-frequency power supply 31 so that frequencies of the radio-frequency power RF used in the same phase period SP(n) in the plurality of cycles CY are respectively set to a plurality of frequencies different from each other. The controller 30*c* determines a plurality of appropriate frequencies of the radio-frequency power for each of the plurality of phase periods SP by selecting an appropriate frequency that minimizes the power level Pr of the reflected waves of the radio-frequency power RF in each of the plurality of phase periods SP among the plurality of frequencies.

In the example illustrated in FIG. 7, the frequency of the radio-frequency power RF in each of the cycles CY(1) to CY(M) is set to a constant frequency, and is set to a frequency different from the frequency of the radio-frequency power RF in the other cycles among the cycles CY(1) to RCY(M). The power level Pr of the reflected waves of the radio-frequency power RF in the phase periods SP(1) to SP(N) in each of the cycles CY(1) to CY(M) is acquired. An appropriate frequency of the radio-frequency power RF for each of the phase periods SP(1) to SP(N) that minimizes the power level Pr of the reflected waves in each of the phase periods SP(1) to SP(N) is selected from the acquired power level Pr of the reflected wave. An appropriate frequency of the radio-frequency power RF for each of the phase periods SP(1) to SP(N) is used as the frequency $f_{RF}$ of the radio-frequency power RF in the phase periods SP(1) to SP(N) in the power adjustment period PPA.

[Second Embodiment of Frequency $f_{RF}$ Determination]

Figure 8:
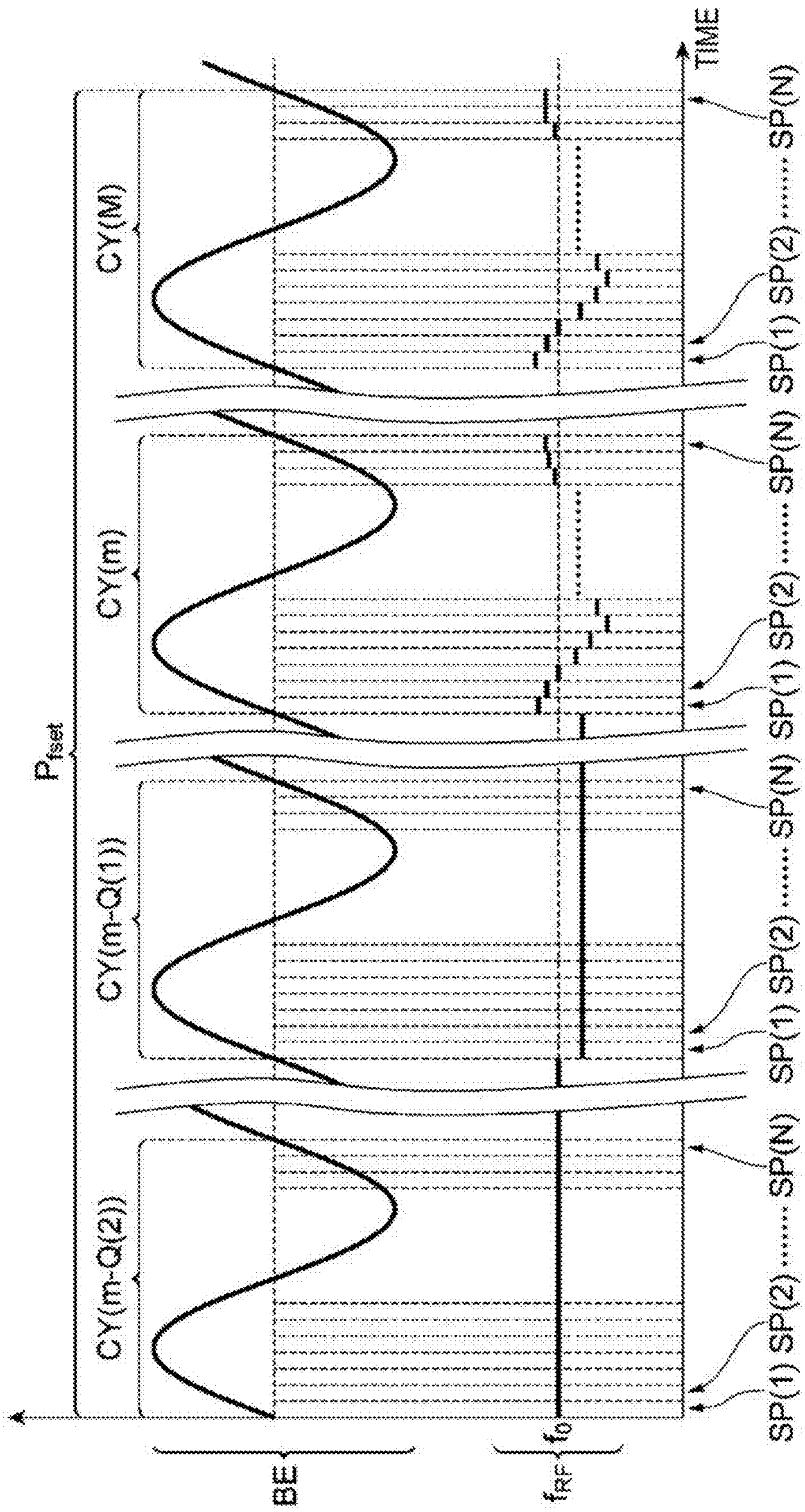
FIG. 8 is a timing chart of an example related to the frequency setting period in the plasma processing apparatus according to the exemplary embodiment.

FIG. 8 is a timing chart of an example related to the frequency setting period in the plasma processing apparatus according to the exemplary embodiment. As illustrated in FIG. 8, in a second embodiment, the frequency setting period $P_{fset}$ includes a plurality of cycles CY (M cycles CY(1) to CY(M)).

The controller 30*c* is configured to adjust the frequency of the radio-frequency power RF in the phase periods SP(n), that is, the phase periods SP(m, n) in the cycle CY(m), according to the change in the power level Pr of the reflected waves of the radio-frequency power RF. The change in the power level Pr of the reflected waves is specified by using the frequencies of the radio-frequency power RF that are different from each other in the corresponding phase period SP(n) in each of the two or more cycles CY before the cycle CY(m).

In one embodiment, the two or more cycles CY before the cycle CY(m) include a first cycle and a second cycle. In the example of FIG. 8, the first cycle is a cycle CY(m−Q(2)), and the second cycle is a cycle after the first cycle, and is a cycle CY(m−Q(1)). Q(1) is an integer of 1 or more, Q(2) is an integer of 2 or more, and Q(1)<Q(2) is satisfied.

The controller 30*c* gives one frequency shift from the frequency of the radio-frequency power RF in a phase period SP(m−Q(2), n) to a frequency f(m−Q(1), n) of the radio-frequency power RF in a phase period SP(m−Q(1), n). Here, f(m,n) represents the frequency of the radio-frequency power RF used in a phase period SP(m,n). The f(m, n) is expressed by f(m, n)=f(m−Q(1), n)+Δ(m, n). Δ(m,n) represents the amount of the frequency shift. One frequency shift is one of a decrement in the frequency and an increment in the frequency. When one frequency shift is a decrement in the frequency, Δ(m,n) has a negative value. When one frequency shift is an increment in the frequency, Δ(m,n) has a positive value.

In FIG. 8, the frequencies of the radio-frequency power RF in the plurality of phase periods SP in the cycle CY(m−Q(2)) are the same and have f0, respectively, but may be different from each other. Further, in FIG. 8, the frequencies of the radio-frequency powers RF in the plurality of phase periods SP in the cycle CY(m−Q(1)) are the same and are set to a frequency reduced from the frequency f0, but may be increased from the frequency f0.

When a power level Pr(m−Q(1), n) decreases from a power level Pr(m−2Q, n) due to one frequency shift, the controller 30*c* sets a frequency f(m, n) to a frequency that has one frequency shift with respect to a frequency f(m−Q, n). Pr(m,n) represents the power level Pr of the reflected waves of the radio-frequency power RF in the phase period SP(m,n).

An amount Δ(m, n) of one frequency shift in the phase period SP(m, n) may be the same as an amount Δ(m−Q(1), n) of one frequency shift in the phase period SP(m−Q(1), n). That is, the absolute value of the amount Δ(m, n) of the frequency shift may be the same as the amount Δ(m−Q(1), n) of the frequency shift. Alternatively, the absolute value of the amount Δ(m, n) of the frequency shift may be larger than the amount Δ(m−Q(1), n) of the frequency shift. Alternatively, the absolute value of the amount Δ(m, n) of the frequency shift may be set so as to increase as the power level Pr(m−Q(1), n) of the reflected waves in the phase period SP(m−Q(1), n) increases. For example, the absolute value of the amount Δ(m, n) of the frequency shift may be determined by the function of the power level Pr(m−Q(1), n) of the reflected waves.

The power level Pr(m−Q(1), n) of the reflected waves may increase from the power level Pr(m−Q(2), n) of the reflected waves due to one frequency shift. In this case, the controller 30*c* may set the frequency f(m, n) to a frequency that has another frequency shift with respect to the frequency f(m−Q(1), n). The frequency of the radio-frequency power RF in each phase period SP(n) in the two or more cycles before the cycle CY(m) may be updated so as to have one frequency shift with respect to the frequency of the radio-frequency power RF in the phase period SP(n) in the previous cycle. In this case, when the power level Pr of the reflected waves or the average value thereof tends to increase in each of the phase periods SP(n) in the two or more cycles, another frequency shift may be given to the frequency of the radio-frequency power RF in the phase period SP(n) in the cycle CY(m). For example, the frequency of the radio-frequency power RF in the phase period SP(n) of the cycle CY(m) may be set to a frequency that has another frequency shift with respect to the frequency of the radio-frequency power of the earliest cycle among the two or more cycles.

When the power level Pr(m,n) of the reflected waves increases from the power level Pr(m−Q(1), n) of the reflected waves due to one frequency shift, the controller 30*c* may set the frequency of the radio-frequency power RF in the phase periods SP(n) in the cycle CY(m+Q(1)) to an intermediate frequency. The cycle CY(m+Q(1)) is a third cycle after the cycle CY(m). The intermediate frequency that may be set in the phase period SP(m+Q(1), n) is a frequency between f(m−Q(1), n) and f(m, n), and may be the average value of f(m−Q(1), n) and f(m, n).

The power level Pr acquired when the intermediate frequency is used in the phase period SP(m+Q(1), n) may become larger than a predetermined threshold value. In this case, the controller 30*c* may set the frequency of the radio-frequency power RF in the phase period SP(n) in the cycle CY(m+Q(2)) to a frequency that has another frequency shift with respect to the intermediate frequency. The cycle CY(m+Q(2)) is a fourth cycle after the cycle CY(m+Q(2)). The threshold value is predetermined. The absolute value of the amount Δ(m+Q(2), n) of another frequency shift is larger than the absolute value of the amount Δ(m, n) of one frequency shift. In this case, it is possible to avoid the fact that the power level Pr of the reflected waves cannot be reduced from a local minimum value. The threshold values for the plurality of phase periods SP in each of the plurality of cycles CY may be the same or different from each other.

In the second embodiment, the frequency of the radio-frequency power RF set for each of the phase periods SP(1) to SP(N) in the cycle CY(M) in the frequency setting period $P_{fset}$ is determined as an appropriate frequency. An appropriate frequency of the radio-frequency power RF for each of the phase periods SP(1) to SP(N) is used as the frequency $f_{RF}$ of the radio-frequency power RF in the phase periods SP(1) to SP(N) in the power adjustment period PPA.

[Third Embodiment of Frequency $f_{RF}$ Determination]

Figure 9:
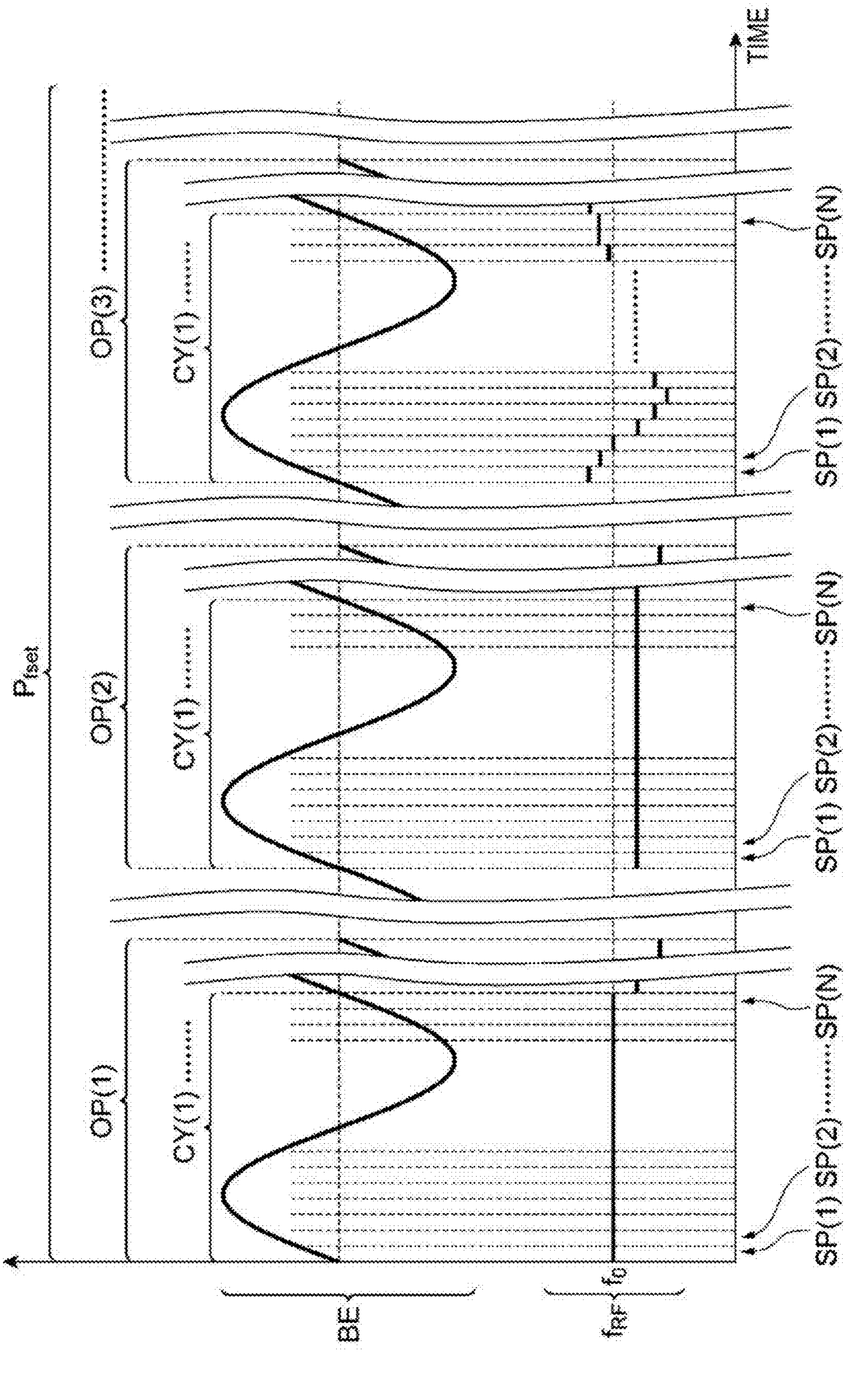
FIG. 9 is a timing chart of an example related to the frequency setting period in the plasma processing apparatus according to the exemplary embodiment.

FIG. 9 is a timing chart of an example related to the frequency setting period in the plasma processing apparatus according to the exemplary embodiment. A third embodiment of determining the frequency $f_{RF}$ illustrated in FIG. 9 is used when the pulse BEP of the electric bias energy BE is supplied in each of the plurality of pulse periods PP. In this embodiment, the frequency setting period $P_{fset}$ includes a plurality of (K) overlapping periods OP. Further, each of the plurality of overlapping periods OP includes a plurality of (M) cycles CY. Each of the plurality of cycles CY includes a plurality of (N) phase periods SP.

In the third embodiment, the controller 30*c* is configured to set the appropriate frequency of the radio-frequency power RF in each of the plurality of phase periods SP in each of the plurality of cycles CY included in each of the plurality of overlapping periods OP. As the appropriate frequency of the radio-frequency power RF supplied in the periods other than the plurality of overlapping periods OP, a time series of frequencies registered in a table prepared in advance may be used.

Hereinafter, first, the setting of the frequency of the radio-frequency power RF in a first overlapping period OP, that is, an overlapping period OP(1) will be described. The controller 30*c* adjusts the frequency of the radio-frequency power RF in a phase period SP(1, m, n) in a cycle CY(1, m) in the overlapping period OP(1) according to the change in the power level Pr of the reflected waves of the radio-frequency power RF. A phase period SP(k, m, n) represents an n-th phase period SP in a cycle CY(k, m) in a k-th overlapping period OP(k). The processing of setting the frequency of the radio-frequency power RF in the phase period SP(1, m, n) in the third embodiment is the same as the processing of setting the frequency of the radio-frequency power RF in the phase period SP(m, n) in the second embodiment.

Hereinafter, the setting of the frequency of the radio-frequency power RF in a second to (T−1)th overlapping periods OP(k) will be described. T is an integer of 3 or more and smaller than K. The frequency of the radio-frequency power RF in the plurality of phase periods SP in the plurality of cycles CY in the overlapping period OP(k) may be set by using the same setting processing as the above-described processing of setting the frequency of the radio-frequency power RF in the plurality of phase periods SP in the plurality of cycles CY in the overlapping period OP(1). In the setting of the frequency of the radio-frequency power RF in the plurality of phase periods SP in a cycle CY(1) in the overlapping period OP(k), a cycle CY(M−1) and a cycle CY(M) in an overlapping period OP(k−1) may be used as a first cycle and a second cycle. Further, in the setting of the frequencies of the radio-frequency power RF in the plurality of phase periods SP in a CY(2) in the overlapping period OP(k), the cycle CY(M) in the overlapping period OP(k−1) and the cycle CY(1) in the overlapping period OP(k) may be used as the first cycle and the second cycle.

In another embodiment, the frequencies of the radio-frequency power RF in the plurality of phase periods SP in the plurality of cycles CY in the overlapping period OP(k) may be set by using the respective frequencies registered in a table prepared in advance.

Hereinafter, the setting of the frequency of the radio-frequency power RF in the overlapping period OP(k) from a T-th to a K-th will be described with reference to FIG. 9. The controller 30*c* adjusts the frequency of the radio-frequency power RF in the phase period SP(n) in the cycle CY(m) in the overlapping period OP(k), that is, in the phase period SP(k, m, n) according to the change in the power level Pr of the reflected waves of the radio-frequency power RF. The change in the power level Pr of the reflected waves is specified by using the frequencies of the radio-frequency powers RF that are different from each other in the corresponding phase period SP(n) in the cycle CY(m) in the two or more overlapping periods OP before the overlapping period OP(k).

In one embodiment, the two or more overlapping periods OP before the overlapping period OP(k) include a first overlapping period and a second overlapping period. The first overlapping period is an overlapping period OP(k−Q(2)), and the second overlapping period is an overlapping period after the first overlapping period, and is an overlapping period OP(k−Q(1)). Q(1) is an integer of 1 or more, Q(2) is an integer of 2 or more, and Q(1)<Q(2) is satisfied.

The controller 30*c* gives one frequency shift from the frequency of the radio-frequency power RF in a phase period SP (k−Q(2), m, n) to a frequency f(k−Q(1), m, n) of the radio-frequency power RF in a phase period SP (k−Q(1), m, n). Here, f(k, m, n) represents the frequency of the radio-frequency power RF used in a phase period SP(k, m, n). The f(k, m, n) is expressed by f(k, m, n)=f(k−Q(1), m, n)+Δ(k, m, n). Δ(k, m, n) represents the amount of the frequency shift. One frequency shift is one of a decrement in the frequency and an increment in the frequency. When one frequency shift is a decrement in the frequency, Δ(k, m, n) has a negative value. When one frequency shift is an increment in the frequency, Δ(k, m, n) has a positive value.

When a power level Pr(k−Q(1), m, n) decreases from a power level Pr(k−Q(2), m, n) due to one frequency shift, the controller 30*c* sets a frequency f(k, m, n) to a frequency that has one frequency shift with respect to the frequency f(k−Q(1), m, n). Pr(k, m, n) represents the power level Pr of the reflected waves of the radio-frequency power RF in the phase periods SP(k, m, n).

The frequency of the radio-frequency power RF in each phase period SP(m, n) of the two or more overlapping periods before the overlapping period OP(k) may be updated to have one frequency shift with respect to the frequency of the radio-frequency power RF in the phase period SP(m, n) in a preceding overlapping period. In this case, when the power level Pr of the reflected waves in each of the phase periods SP(m, n) in the two or more overlapping periods or the average value thereof tends to increase, another frequency shift may be given to the frequency of the radio-frequency power RF in the phase period SP(m, n) in the overlapping period OP(k). For example, the frequency of the radio-frequency power RF in the phase period SP(m, n) in the overlapping period OP(k) may be set to a frequency that has another frequency shift with respect to the frequency of the radio-frequency power RF in the earliest overlapping period among the two or more overlapping periods.

In one embodiment, the amount Δ(m, n) of one frequency shift in the phase period SP(k, m, n) may be the same as an amount Δ(k−Q(1), m, n) of one frequency shift in a phase period SP(k−Q(1), m, n). That is, the absolute value of an amount Δ(k, m, n) of the frequency shift may be the same as the amount Δ(k−Q(1), m, n) of the frequency shift. Alternatively, the absolute value of the amount Δ(k, m, n) of the frequency shift may be larger than the amount Δ(k−Q(1), m, n) of the frequency shift. Alternatively, the absolute value of the amount Δ(k, m, n) of the frequency shift may be set so as to increase as the power level Pr(k−Q(1), m, n) of the reflected waves in the phase period SP(k−Q(1), m, n) increases. For example, the absolute value of the amount Δ(k, m, n) of the frequency shift may be determined by the function of the power level Pr(k−Q(1), m, n) of the reflected waves.

The power level Pr(k−Q(1), m, n) of the reflected waves may increase from a power level Pr(k−Q(2), m, n) of the reflected waves due to one frequency shift. In this case, the controller 30*c* may set the frequency f(k, m, n) to a frequency that has another frequency shift with respect to the frequency f(k−Q(1), m, n).

Further, a power level Pr(k, m, n) of the reflected waves may increase from a power level Pr(k−Q(1), m, n) of the reflected waves due to one frequency shift. In this case, the controller 30*c* may set the frequency of the radio-frequency power RF in a phase period SP(k+Q(1), m, n) to the intermediate frequency. That is, in this case, the frequency of the radio-frequency power RF in the phase period SP(n) in the cycle CY(m) in an overlapping period OP(k+Q(1)) may be set to the intermediate frequency. The overlapping period OP(k+Q(1)) is a third overlapping period after the overlapping period OP(k). The intermediate frequency that may be set in the phase period SP(k+Q(1), m, n) is the frequency between f(k−Q(1), m, n) and f(k, m, n), and may be the average value of f(k−Q(1), m, n) and f(k, m, n).

Further, the power level Pr acquired when the intermediate frequency is used in the phase period SP(k+Q(1), m, n)

becomes larger than the predetermined threshold value. In this case, the controller 30c may set the frequency of the radio-frequency power RF in a phase period SP(k+Q(2), m, n) to a frequency that has another frequency shift with respect to the intermediate frequency. That is, in this case, another frequency shift may be given to the frequency of the radio-frequency power RF in the phase period SP(n) in the cycle CY(m) in an overlapping period OP(k+Q(2)). The overlapping period OP(k+Q(2)) is a fourth overlapping period after the overlapping period OP(k+Q(1)). The threshold value is predetermined. The absolute value of an amount Δ(k+Q(2), m, n) of another frequency shift is larger than the absolute value of the amount Δ(k, m, n) of one frequency shift. In this case, it is possible to avoid the fact that the power level Pr of the reflected waves cannot be reduced from a local minimum value. The threshold values for the plurality of phase periods SP in each of the plurality of cycles CY in the plurality of overlapping periods OP may be the same or different from each other.

In the third embodiment, the frequency of the radio-frequency power RF set for each of the phase periods SP(1) to SP(N) in the plurality of cycles CY in the overlapping period OP(K) in the frequency setting period $P_{fset}$ is determined as an appropriate frequency. The appropriate frequency of the radio-frequency power RF for each of the phase periods SP(1) to SP(N) in the plurality of cycles CY in the overlapping period OP(K) is used as the frequency $f_{RF}$ of the radio-frequency power RF in each of the phase periods SP(1) to SP(N) in the plurality of cycles CY in the plurality of overlapping periods OP in the power adjustment period PPA.

Figure 10:
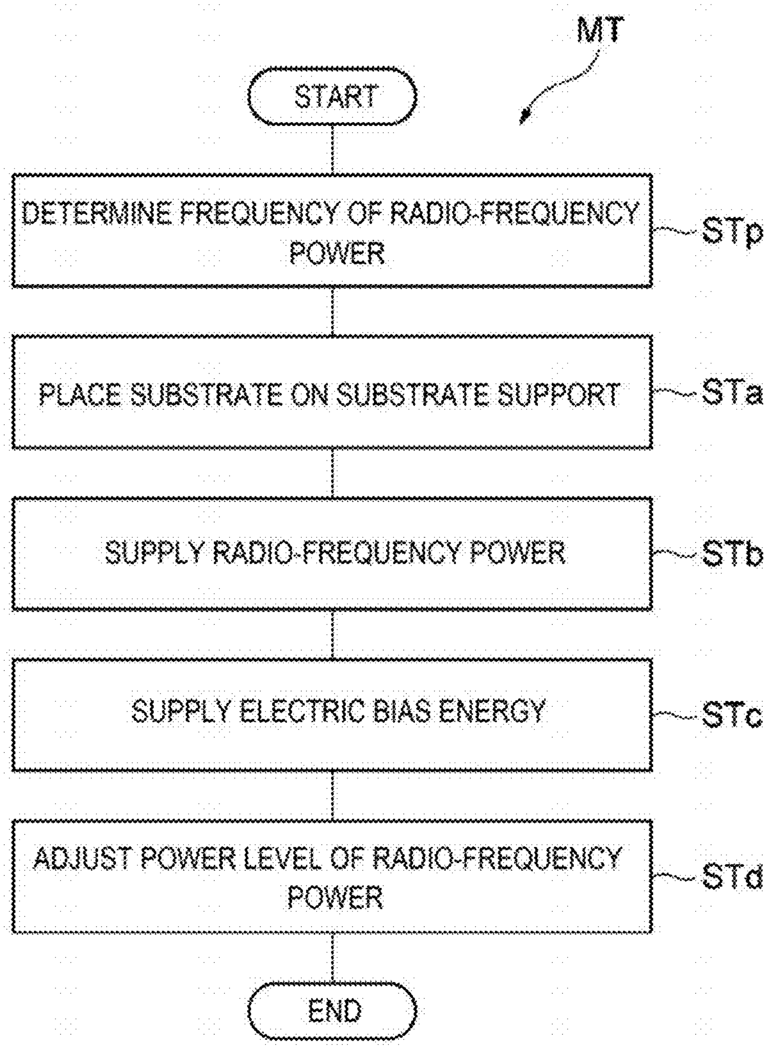
FIG. 10 is a flowchart of a plasma processing method according to an exemplary embodiment.

Reference will be made to FIG. 10. FIG. 10 is a flowchart of a plasma processing method according to an exemplary embodiment.

The plasma processing method illustrated in FIG. 10 (hereinafter, referred to as a "method MT") includes steps STa to STd. The method MT may further include step STp. Step STp is performed in the frequency setting period $P_{fset}$. In step STp, the frequency $f_{RF}$ of the radio-frequency power RF used in the power adjustment period PPA is determined. For details on setting the frequency $f_{RF}$ of the radio-frequency power RF in step STp, refer to the description of the first to third embodiments of determining the frequency $f_{RF}$ Step STp may be performed before or after step STa.

In step STa, the substrate W is placed on the substrate support 11. The subsequent step STb is performed to generate plasma in the chamber 10. In step STb, the radio-frequency power RF is supplied. While step STb is being performed, a processing gas is supplied from the gas supply 20 into the chamber 10. Further, the pressure in the chamber 10 is reduced to a designated pressure by the exhaust system 40. In the subsequent step STc, the electric bias energy BE is supplied to the bias electrode.

Step STd is performed in the power adjustment period PPA. Step STd is performed when step STb and step STc are being performed. In step STd, the output power level of the radio-frequency power RF in the plurality of phase periods SP in the cycle CY of the electric bias energy BE is adjusted. The output power level of the radio-frequency power RF in the plurality of phase periods SP in the cycle CY is adjusted such that the evaluation value in each of the plurality of phase periods SP in the cycle CY is equal to or less than the allowable value PAC. For the adjustment of the output power level of the radio-frequency power RF in the power adjustment period PPA, refer to the above description of the plasma processing apparatus 1. In the power adjustment period PPA, a predetermined frequency in the frequency setting period $P_{fset}$ may be used as the frequency $f_{RF}$ of the radio-frequency power RF in each phase period SP.

While various exemplary embodiments have been described above, various additions, omissions, substitutions and changes may be made without being limited to the exemplary embodiments described above. Indeed, the embodiments described herein may be embodied in a variety of other forms.

In another embodiment, the plasma processing apparatus may be an inductively-coupled plasma processing apparatus, an ECR plasma processing apparatus, a helicon wave excited plasma processing apparatus, or a surface wave plasma processing apparatus. In any plasma processing apparatus, the radio-frequency power RF is used for generating plasma.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A plasma processing apparatus, comprising:
- a chamber;
- a substrate support provided in the chamber, the substrate support including an electrode;
- a radio-frequency power supply configured to supply radio-frequency power to generate plasma in the chamber; and
- a bias power supply configured to supply electric bias energy to the electrode to draw ions into a substrate placed on the substrate support, wherein
- the electric bias energy has a cycle having a time length which is a reciprocal of a bias frequency in a range of 50 kHz to 27 MHz,
- one or more phase periods in which an evaluation value is larger than a first value in a preceding cycle of the electric bias energy are specified, the evaluation value being a power level of reflected waves of the radio-frequency power or a value of a ratio of the power level of the reflected waves to an output power level of the radio-frequency power, and
- the radio-frequency power supply is further configured to:
  - reduce an output power level of the radio-frequency power in each of the one or more phase periods in a subsequent cycle of the electric bias energy such that the evaluation value is less than or equal to the first value; and
  - adjust the output power level of the radio-frequency power in phase periods other than the one or more phase periods in the subsequent cycle such that an average value of the output power level of the radio-frequency power in the subsequent cycle becomes a predetermined value.

2. The plasma processing apparatus according to claim 1, wherein the radio-frequency power supply includes:
- a signal generator configured to generate a radio-frequency signal; and
- an amplifier configured to amplify the radio-frequency signal to generate the radio-frequency power.

3. The plasma processing apparatus according to claim 2, wherein the radio-frequency power supply is configured to adjust the output power level of the radio-frequency power by adjusting an amplitude of the radio-frequency signal.

4. The plasma processing apparatus according to claim 2, wherein the radio-frequency power supply is configured to adjust the output power level of the radio-frequency power by adjusting an amplification factor of the radio-frequency signal in the amplifier.

5. The plasma processing apparatus according to claim 1, wherein the radio-frequency power supply includes:

a signal generator configured to generate a radio-frequency signal;

an attenuator configured to attenuate the radio-frequency signal to generate an attenuated signal; and an amplifier configured to amplify the attenuated signal to generate the radio-frequency power, and the radio-frequency power supply is configured to adjust the output power level of the radio-frequency power by adjusting an attenuation factor of the radio-frequency signal in the attenuator.

6. The plasma processing apparatus according to claim 1, wherein the radio-frequency power supply is further configured to set a frequency of the radio-frequency power in each phase period of the plurality of phase periods in the cycle to a predetermined frequency so as to suppress the power level of the reflected waves of the radio-frequency power.

7. A plasma processing method, comprising:

placing a substrate on a substrate support provided in a chamber of a plasma processing apparatus;

supplying radio-frequency power, from a radio-frequency power supply, to generate plasma in the chamber;

supplying electric bias energy, from a bias power supply to an electrode in the substrate support, to draw ions from the plasma into the substrate; and adjusting an output power level of the radio-frequency power, wherein the electric bias energy has a cycle having a time length which is a reciprocal of a bias frequency in a range of 50 kHz to 27 MHz, one or more phase periods in which an evaluation value is larger than a first value in a preceding cycle of the electric bias energy are specified, the evaluation value being a power level of reflected waves of the radio-frequency power or a value of a ratio of the power level of the reflected waves to an output power level of the radio-frequency power, and the adjusting the output power level includes:

reducing an output power level of the radio-frequency power in each of the one or more phase periods in a subsequent cycle of the electric bias energy such that the evaluation value is less than or equal to the first value; and adjusting the output power level of the radio-frequency power in phase periods other than the one or more phase periods in the subsequent cycle such that an average value of the output power level of the radio-frequency power in the subsequent cycle becomes a predetermined value.

8. The plasma processing method according to claim 7, further comprising:

setting a frequency of the radio-frequency power in each of the plurality of phase periods in the cycle to a predetermined frequency so as to suppress the power level of the reflected waves of the radio-frequency power.

9. A plasma processing apparatus, comprising:

a radio-frequency power supply configured to supply radio-frequency power to generate plasma in the chamber;

a bias power supply configured to supply electric bias energy to an electrode, of a substrate support in a chamber, to draw ions into a substrate that is placed on the substrate support, wherein the electric bias energy has a cycle having a time length which is a reciprocal of a bias frequency in a range of 50 kHz to 27 MHZ, one or more phase periods in which an evaluation value is larger than a first value in a preceding cycle of the electric bias energy are specified, the evaluation value being a power level of reflected waves of the radio-frequency power or a value of a ratio of the power level of the reflected waves to an output power level of the radio-frequency power, and the radio-frequency power supply is further configured to;

reduce an output power level of the radio-frequency power in each of the one or more phase periods in a subsequent cycle of the electric bias energy such that the evaluation value is less than or equal to the first value; and adjust the output power level of the radio-frequency power in phase periods other than the one or more phase periods in the subsequent cycle such that an average value of the output power level of the radio-frequency power in the subsequent cycle becomes a predetermined value.

10. The plasma processing apparatus according to claim 9, wherein the radio-frequency power supply is configured to adjust the output power level of the radio-frequency power in phase periods other than the one or more phase periods in each cycle such that an average value of the output power level of the radio-frequency power in each cycle becomes a predetermined value.

* * * * *